US011022486B2

(12) United States Patent
Tong et al.

(10) Patent No.: US 11,022,486 B2
(45) Date of Patent: Jun. 1, 2021

(54) $MOS_2$ BASED PHOTOSENSOR FOR DETECTING BOTH LIGHT WAVELENGTH AND INTENSITY

(71) Applicant: National University of Singapore, Singapore (SG)

(72) Inventors: Yu Tong, Singapore (SG); Chunxiang Zhu, Singapore (SG)

(73) Assignee: National University of Singapore, Singapore (SG)

( * ) Notice: Subject to any disclaimer, the term of this patent is extended or adjusted under 35 U.S.C. 154(b) by 149 days.

(21) Appl. No.: 16/273,868

(22) Filed: Feb. 12, 2019

(65) Prior Publication Data
US 2019/0257690 A1    Aug. 22, 2019

Related U.S. Application Data

(60) Provisional application No. 62/629,176, filed on Feb. 12, 2018.

(51) Int. Cl.
*H01L 29/49*   (2006.01)
*G01J 1/44*    (2006.01)
(Continued)

(52) U.S. Cl.
CPC . *G01J 1/44* (2013.01); *G01J 3/50* (2013.01); *H01L 29/42356* (2013.01);
(Continued)

(58) Field of Classification Search
CPC .................. H01L 29/778; H01L 21/02568
See application file for complete search history.

(56) References Cited

U.S. PATENT DOCUMENTS 5,923,033 A    7/1999  Takayama et al.
9,472,686 B2  10/2016  Hersam et al.
(Continued)

FOREIGN PATENT DOCUMENTS

WO    WO-2014/178016 A2    11/2014

OTHER PUBLICATIONS

Arco, L. Gomez De, et al., "Continuous, Highly Flexible, and Transparent Graphene Films by Chemical Vapor Deposition for Organic Photovoltaics," American Chemical Society, ACS Nano, vol. 4, No. 5, May 2010, pp. 2865-2873.
(Continued)

*Primary Examiner* — Thanh Luu
(74) *Attorney, Agent, or Firm* — Cesari and McKenna, LLP; James A. Blanchette

(57) ABSTRACT

In various embodiments, a simple, robust molybdenum disulfide ($MoS_2$) based photosensor is provided that is able to detect both light intensity and wavelength. The $MoS_2$ based photosensor may be structured as a field effect transistor (FET) with a back-gate configuration, including $MoS_2$ nanoflake layers, an insulating layer coated, doped substrate, and source, drain and backgate electrodes. The photoresponse of the $MoS_2$ based photosensor exhibits a fast response component that is only weakly dependent on the wavelength of light incident on the sensor and a slow response component that is strongly dependent on the wavelength of light incident on the sensor. The fast response component alone may be analyzed to determine intensity of the light, while the slow response component may be analyzed to determine the wavelength of the light.

18 Claims, 17 Drawing Sheets

(51) Int. Cl.
  H01L 31/112 (2006.01)
  H01L 31/032 (2006.01)
  H01L 29/45 (2006.01)
  G01J 3/50 (2006.01)
  H01L 29/423 (2006.01)

(52) U.S. Cl.
  CPC ............ H01L 29/45 (2013.01); H01L 29/495 (2013.01); H01L 31/032 (2013.01); H01L 31/1126 (2013.01); *G01J 2001/4473* (2013.01)

(56) References Cited

U.S. PATENT DOCUMENTS

| 2016/0020352 | A1 | 1/2016 | Konstantatos et al. |
| 2016/0093491 | A1 | 3/2016 | Choi et al. |
| 2016/0372615 | A1* | 12/2016 | Yang ..................... H01L 31/032 |
| 2018/0006067 | A1* | 1/2018 | Ogawa .................. H01L 31/028 |
| 2018/0072947 | A1* | 3/2018 | Pickett ................. C09K 11/681 |
| 2019/0123223 | A1* | 4/2019 | Astley ............. H01L 31/035209 |

OTHER PUBLICATIONS

Bao, Wenzhog, et al., "High Mobility Ambipolar MoS$_2$ Field-Effect Transistors: Substrate and Dielectric Effects," Applied Physics Letters, vol. 102, No. 4, Jan. 29, 2013, pp. 1-12.

Chen, et al., "Highly Responsive MoS$_2$ Photodetectors Enhanced by Graphene Quantum Dots," Nature, Scientific Reports, vol. 5, Jul. 3, 2015, p. 1-9.

Dan, Yaping, et al., "Intrinsic Response of Graphene Vapor Sensors," Nano Letters, vol. 9, No. 4, Apr. 2009, pp. 1472-1475.

Eda, Goki, et al., "Photoluminescence from Chemically Exfoliated MoS$_2$," American Chemical Society, ACS Publications, Nano Letters, Letter, vol. 11, No. 12, Dec. 2011, pp. 5111-5116.

He, Qiyuan, et al., "Fabrication of Flexible MoS$_2$ Thin-Film Transistor Arrays for Practical Gas-Sensing Applications," Wiley-VCH Verlag GmbH & Co. KGaA, Weinheim, Nano Micro Small, vol. 8, No. 19, Oct. 2012, pp. 2994-2999.

He, Ruicong, "Photocurrent Study on Bulk and Few Layers MoS$_2$ Field Effect Transistors," Thesis, The HKU Scholars Hub, University of Hong Kong, Pokfulam, Hong Kong, Feb. 2014, pp. 1-58.

Late, Dattatray J., et al., "Sensing Behavior of Atomically Thin-Layered MoS$_2$ Transistors," ACS Nano, vol. 7, No. 6, Jun. 2013, pp. 4879-4891.

Li, Hai, et al., "Fabrication of Single- and Multilayer MoS$_2$ Film-Based Field-Effect Transistors for Sensing NO at Room Temperature," Wiley-VCH Verlag GmbH & Co. KGaA, Weinheim, Nano Micro Small, vol. 8, No. 1, Jan. 2012, pp. 63-67.

Mak, Kin Fai, et al., "Atomically Thin MoS2: A New Direct-Gap Semiconductor," Physical Review Letters, vol. 105, No. 13, Sep. 24, 2010, pp. 1-4.

Miao, J., "Surface Plasmon-Enhanced Photodetection in Few Layer MoS$_2$ Phototransistors with Au Nanostructure Arrays," Wiley-VCH Verlag GmbH & Co. KGaA, Weinheim, Materials Views, Nano Micro Small, vol. 11, No. 20, May 2015, pp. 2392-2398.

Novoselov, K. S., et al., "Electric Field Effect in Atomically Thin Carbon Films," Science, vol. 306, No. 5696, Oct. 22, 2004, pp. 666-669.

Perkins, F.K., et al., "Chemical Vapor Sensing with Monolayer MoS$_2$," American Chemical Society, ACS Publications, Nano Letters, vol. 13, No. 2, Jan. 22, 2013, pp. 668-673.

Radisavljevic, B., et al., "Single-layer MoS$_2$ Transistors," Macmillan Publishers Limited, Nature Nanotechnology, Letters, vol. 6, No. 3, Mar. 2011, pp. 147-150.

Schedin, F., et al., "Detection of Individual Gas Molecules adsorbed on Graphene," Nature Materials, Letters, vol. 6, No. 9, Sep. 2007, pp. 652-655.

Schwierz, Frank, "Graphene Transistors," Nature Nanotechnology, Review Article, vol. 5, No. 7, Jul. 2010, pp. 487-496.

Shen, Wei-Chu, et al., "Photoconductivities in MoS2 Nanoflake Photoconductors," Springer, Nano Express, Open Access, Nanoscale Research Letters, vol. 11, Issue 124, 2016, pp. 1-7.

Tong, Yu, et al.,"MoS2 FET Based Oxygen Sensors with Gate Voltage Stress Induced Performance Enhancement," Applied Physics Letters, vol. 107, No. 12, Sep. 2015, pp. 470-471.

Tongay, Sefaattin et al., "Broad-Range Modulation of Light Emission in Two-Dimensional Semiconductors by Molecular Physisorption Gating," American Chemical Society, ACS Publications, Nano Letters, vol. 13, No. 6, Apr. 29, 2013, pp. 2831-2836.

Tsai, Dung-Sheng, "Few-Layer MoS$_2$ with High Broadband Photogain and Fast Optical Switching for Use in Harsh Environments," American Chemical Society, ACS Nano, vol. 7, No. 5, Apr. 2013, pp. 3905-3911.

Wang, Xudong, et al.,"Ultrasensitive and Broadband MoS$_2$ Photodetector Driven by Ferroelectrics," Wiley-VCH Verlag GmbH & Co. KGaA, Weinheim, Advanced Materials, Materials Views, vol. 27, Issue 42, Nov. 11, 2015, pp. 1-7.

Wang, Yan, et al., "Supercapacitor Devices Based on Graphene Materials," American Chemical Society, ACS Publications, Journal of Physical Chemistry C, vol. 113, No. 30, Jul. 6, 2009, pp. 13103-13107.

Lopez-Sanchez, Oriol, et al., "Ultrasensitive Photodetectors based on Monolayer MoS$_2$," Macmillan Publishers Limited, Nature Nanotechnology, vol. 8, Jul. 2013, pp. 497-501.

Zhang, Wenjing, et al., "High-Gain Phototransistors Based on a CVD MoS$_2$ Monolayer," Wiley-VCH Verlag GmbH & Co. KGaA, Weinheim, Advanced Materials, Materials Views, vol. 25, No. 25, Jul. 2013, pp. 3456-3461.

Zhang, Wenjing, et al., "Ultrahigh-Gain Photodetectors Based on Atomically Thin Graphene-MoS$_2$ Heterostructures," Scientific Reports, Nature, vol. 4, Jan. 2014, p. 1-8.

Yin, Zongyou, et al., "Single-Layer MoS$_2$ Phototransistors," ACS Nano, Article, vol. 6, No. 1, Jan. 2012, pp. 74-80.

* cited by examiner

MOS₂ BASED PHOTOSENSOR FOR DETECTING BOTH LIGHT WAVELENGTH AND INTENSITY

RELATED APPLICATIONS

The present application claims priority to U.S. Provisional Patent Application No. 62/629,176, titled "MoS₂ Based Photosensor Detecting Both Light Wavelength and Intensity", filed by Yu Tong et al., on Feb. 12, 2018, the contents of which are incorporated by reference herein in their entirety.

BACKGROUND

Technical Field

The present disclosure relates generally to photosensors, and more specifically to designs for photosensors that are able to detect both intensity and wavelength.

Background Information

Measuring color is of great importance in applications including agriculture, manufacturing, environmental and medical applications. Color has a deterministic relationship with the wavelength of the light reflecting off an object, such that color is essentially a measurement of light wavelength. Color measurement techniques have experienced a tremendous advancement in technology during the past 40 years. During this 40 year period, the techniques have become more accurate, reliable, flexible, smaller, and cheaper. However, conventional color measurement techniques still suffer from shortcomings, included the requirement of complicated, delicate optical structures that are susceptibility to mechanical vibrations.

FIG. 1 is a block diagram of a conventional color measurement instrument that includes a spectrophotometer 110 and colorimeter 120. The instrument requires a light source 130, light diversion structures such as a prism 140 and filters 150 and photosensors 160, 170. The photosensors employed in this type of conventional color measurement instrument are color-blind, indicating that they cannot distinguish the wavelength of the light. The function of distinguishing wavelength is accomplished by the light diversion structures (i.e. the prism 140 and filters 150) that are used to filter the optical signals into single-wavelength light. The employment of these light diversion structures make the instrument complicated, and these structures are excessively dedicated and susceptible to external disturbances (vibrations).

Temperature is the most frequently measured physical quantity, second only to time. Temperature measurement plays an important role in a wide variety of applications, including agriculture, manufacturing, environmental and medical applications. There exists a broad range of techniques to measure temperature, which utilize instruments such as thermocouples, thermistors, pyrometers and infrared thermometers. However, these conventional temperature measurement techniques suffer from a variety of shortcomings.

Temperature measurement techniques that utilize infrared thermometers are particularly commonly used in certain applications because they offer noncontact measurement and can be used in hazardous and/or high temperature environment. The working principle of an infrared thermometer is that every object emits optical energy, and this optical energy produces a radiation spectra, where wavelength and temperature are correlated. FIG. 2 is a graph 200 showing radiation specta of a blackbody with varying temperature. As can be seen, the peak wavelength changes with increasing temperature.

In conventional techniques involving an infrared thermometer, emitted optical energy comes from an object and reaches the instrument through an optical system, which focuses the energy onto one or more photosensors. A photosensor (which is color-blind) then converts the infrared energy at a certain wavelength into an electrical signal. The electrical signal is then converted into a temperature value based on a calibration equation and the known emissivity of a target of the measurement. Because different targets emit an optimum amount of infrared energy at different wavelengths, each target may require a different optical system and photosensor. That is, a given infrared thermometer may be suitable for measuring only a certain target or certain class of targets, and is not universally useful. For example, a photosensor with a narrow spectral range centered at 3.43 μm may be optimized for measuring the surface temperature of polyethylene and related materials, a photosensor set up for 5 μm may be optimized to measure glass surfaces, while a photosensor centered at 1 am may be suited for metals and foils.

Substance detection is also of great importance in a variety of applications. For example, in environmental sensing applications it may be important to detect pollutants, including harmful compounds such as sulfur dioxide ($SO_2$), nitric oxide (NO), nitrogen dioxide ($NO_2$), particulates such as soot, etc. To detect compounds, spectroscopy techniques have commonly been utilized. A spectroscope is used to look for the unique absorption peaks at certain wavelengths corresponding to the compounds. However, a spectroscope is generally very expensive and bulky. To detect particulate concentrations, for example in air or water, one common technique is to measure loss of light intensity due to particle scattering. While such a technique may be implemented inexpensively, it does not provide information related to the composition of the particulates. Should one desire to both detect particulate concentrations and determine composition, multiple instruments may be required.

A simple, robust photosensor that could detect both light intensity and wavelength could address many of the above noted shortcomings of existing color measurement, temperature measurement, and environmental sensing techniques. However, such a photosensor does not currently exist. Accordingly, there is a need for an improved photosensor that is able to detect both light intensity and wavelength

SUMMARY

In various embodiments, a simple, robust molybdenum disulfide ($MoS_2$) based photosensor is provided that is able to detect both light intensity and wavelength. The $MoS_2$ based photosensor may be structured as a field effect transistor (FET) with a back-gate configuration, including $MoS_2$ nanoflake layers, an insulting layer-coated, doped doped substrate, and source, drain and backgate electrodes. The photoresponse of the $MoS_2$ based photosensor exhibits a fast response component that is only weakly dependent on the wavelength of light incident on the sensor and a slow response component that is strongly dependent on the wavelength of light incident on the sensor. The fast response component alone may be analyzed to determine intensity of the light, while the slow response component may be analyzed to determine the wavelength of the light.

Such a MoS$_2$ based photosensor may address many of the above noted shortcomings of prior sensors. For example, such a sensor may be used in measurement applications, absent the need for the complicated, delicate optical structures required by conventional sensors, as a universal solution in temperature measurement applications, avoiding the typical requirement of different optical systems and photosensors for different materials, and in environmental sensing application, avoiding the common need for multiple instruments to detect particulate concentrations and determine composition thereof.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION OF EXAMPLE EMBODIMENTS

An Example MoS$_2$ Based Photosensor

Figure 1:
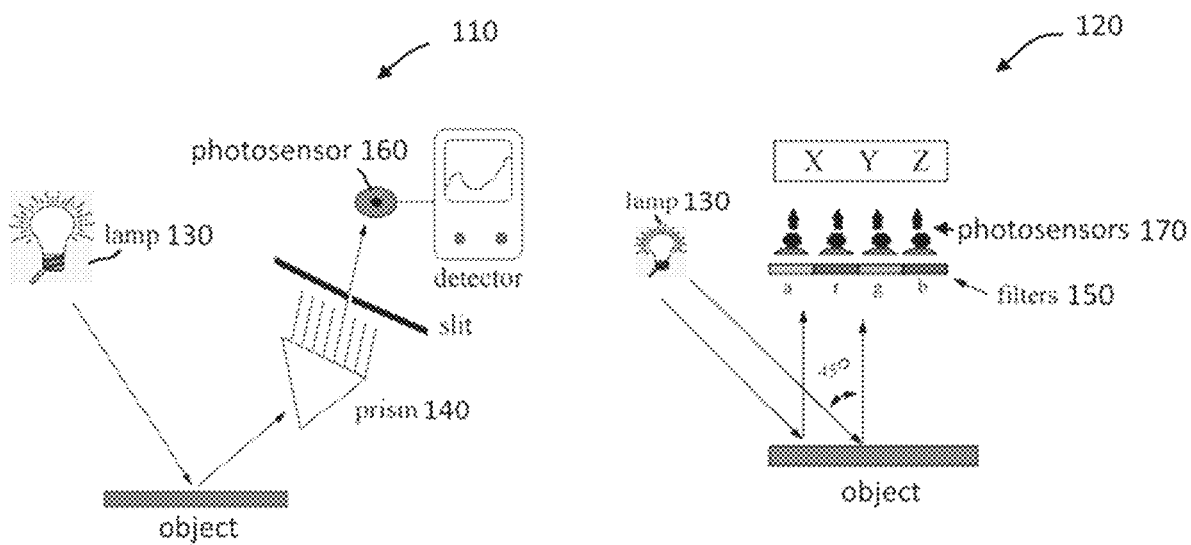
FIG. 1 is a block diagram of a conventional color measurement instrument that includes a spectrophotometer and colorimeter.
Figure 2:
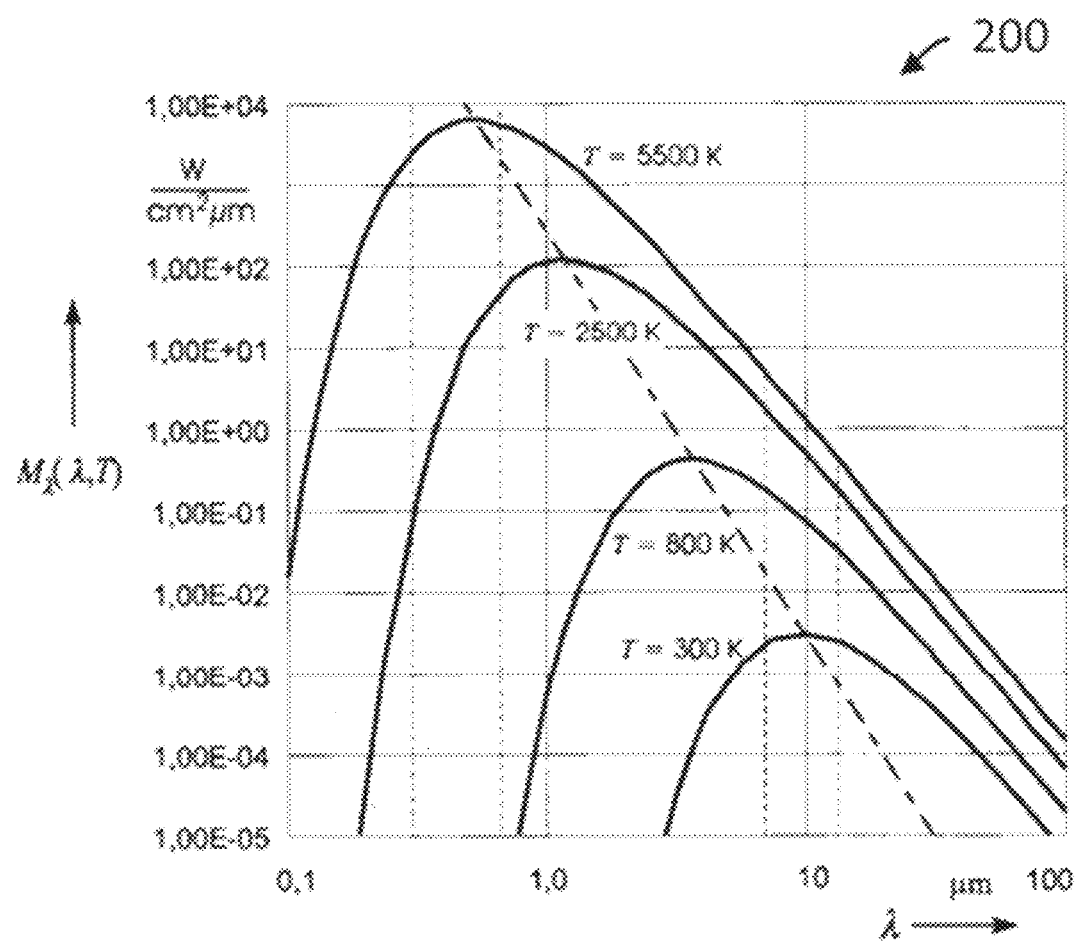
FIG. 2 is a graph showing radiation specta of a blackbody with varying temperature.
Figure 3:
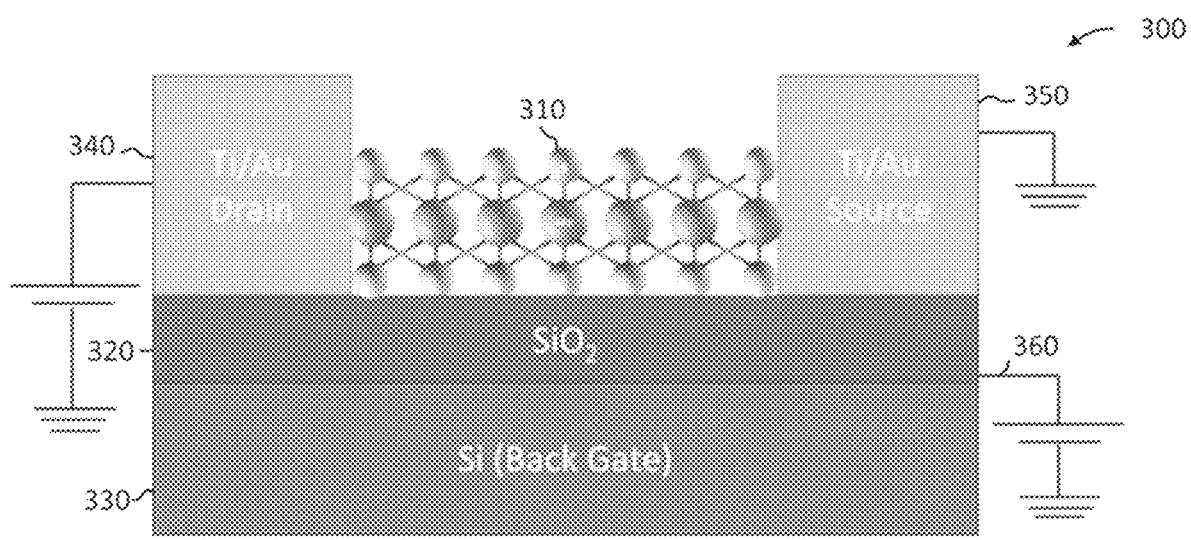
FIG. 3 is a schematic diagram of an example MoS$_2$ based photosensor structured as a FET with a back-gate configuration.

FIG. 3 is a schematic diagram of an example MoS$_2$ based photosensor 300 structured as a FET with a back-gate configuration. The sensor 300 includes MoS$_2$ layers 310, for example MoS$_2$ nanoflake layers. The MoS$_2$ nanoflakes may be prepared using any of variety of techniques, for example, mechanical exfoliation. The number of layers may be estimated by any of variety of techniques, for example, optical microscope inspection with contrast calibration and/or Raman spectroscopy. The MoS$_2$ nanoflake layers 310 are disposed upon an insulating layer-coated, doped substrate, for example, a doped silicon (Si) substrate coated with a silicon dioxide (SiO$_2$) insulating layer. The SiO$_2$ insulating layer coating 320 may have any of a variety of thicknesses, for example, a thickness of 285 nm. The Si substrate 330 may be pre-cleaned and heavily p-type doped, among other alternatives. A drain electrode 340 and a source electrode 350 may be laterally disposed upon the coated, doped substrate with respect to the MoS$_2$ nanoflake layers 310. The drain electrode 340 and the source electrode 350 may be made from any of a variety of suitable materials, for example, gold (Au), using any of variety of techniques, for example, electron beam lithography (EBL) with polymethylmethacrylate (PMMA) and methyl isobutyl ketone (MIBK) development, followed by thermal evaporation and a lift-off process. A backgate electrode 360 may be formed in the doped substrate. The backgate electrode 360 may be formed using any of a variety of techniques, for example, by scratching the Si substrate 330 and depositing silver (Ag) paste. The MoS$_2$ based photosensor 300 may be wire bonded to chip, for example, using alumina wire.

The MoS$_2$ based photosensor 300 may be part of a larger instrument that includes an electrical parameter analyzer (not shown). The photoresponse (e.g., in terms of drain current verses time) of the MoS$_2$ based photosensor 300 may be measured using the electrical parameter analyzer, which may be coupled to the drain electrode 340. The electrical parameter analyzer measures the photoresponse of the device to determine both light intensity and wavelength. Specifically, the photoresponse of the MoS$_2$ based photosensor 300 exhibits a fast response component and a slow response component. As used herein, a "fast response component" refers to a change in current at the drain electrode 340 (i.e. a change in the drain current $I_{DS}$) that occurs within an interval of time immediately after the MoS$_2$ based photosensor 300 is subject to light. In one embodiment, the interval of time is 1 second, such that the fast response component is a change in drain current within the first 1 second after the MoS$_2$ based photosensor 300 is subject to light. As used herein, the term "slow response component" refers to a further change in current at the drain electrode 340 (i.e. the drain current $I_{DS}$) that occurs after expiration of the interval of time that defines the fast response component. In one embodiment, where interval of time is 1 second, the slow response component is a change in drain current that occurs subsequent to 1 second after the $MoS_2$ based photosensor 300 is subject to light. The slow response component is strongly related to wavelength of light incident on the sensor 300, while the fast response component is only weakly dependent on the wavelength of light incident on the sensor 300. The slow response component determines the wavelength of the light and the fast response component determines intensity of the light.

Experimental Results and Principles of Operation

Figure 4A:
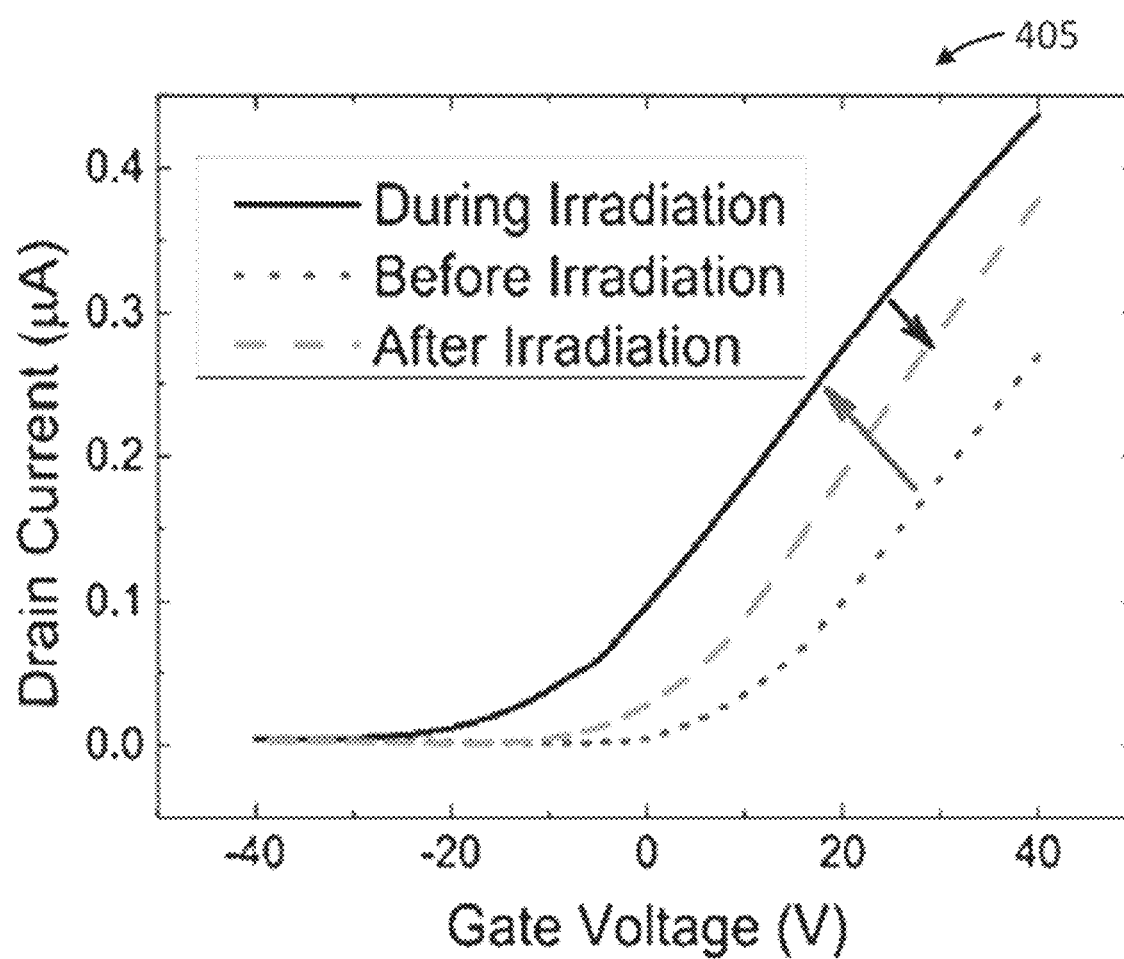
FIG. 4a is a graph illustrating drain current versus gate voltage ($I_{DS}$-$V_{GS}$) of an example MoS$_2$ based photosensor before, during and after white light irradiation at air ambient.

FIG. 4a is a graph 405 illustrating drain current versus gate voltage ($I_{DS}$-$V_{GS}$) of an example $MoS_2$ based photosensor before, during and after white light irradiation at air ambient. In this example, irradiation time may be 500 ms. Before irradiation, the measured $I_{DS}$-$V_{GS}$ curve exhibits a typical n-type semiconductor behavior of $MoS_2$. Under light irradiation, the $I_{DS}$-$V_{GS}$ curve shifts leftwards. After turning off the light, the measured $I_{DS}$-$V_{GS}$ curve shifts backwards. The shift in $I_{DS}$-$V_{GS}$ curve is evidence of the change in doping level on $MoS_2$. Under light irradiation, electron and hole pairs are generated, causing $I_{DS}$ to increase and the $I_{DS}$-$V_{GS}$ curve shift leftwards.

Figure 4B:
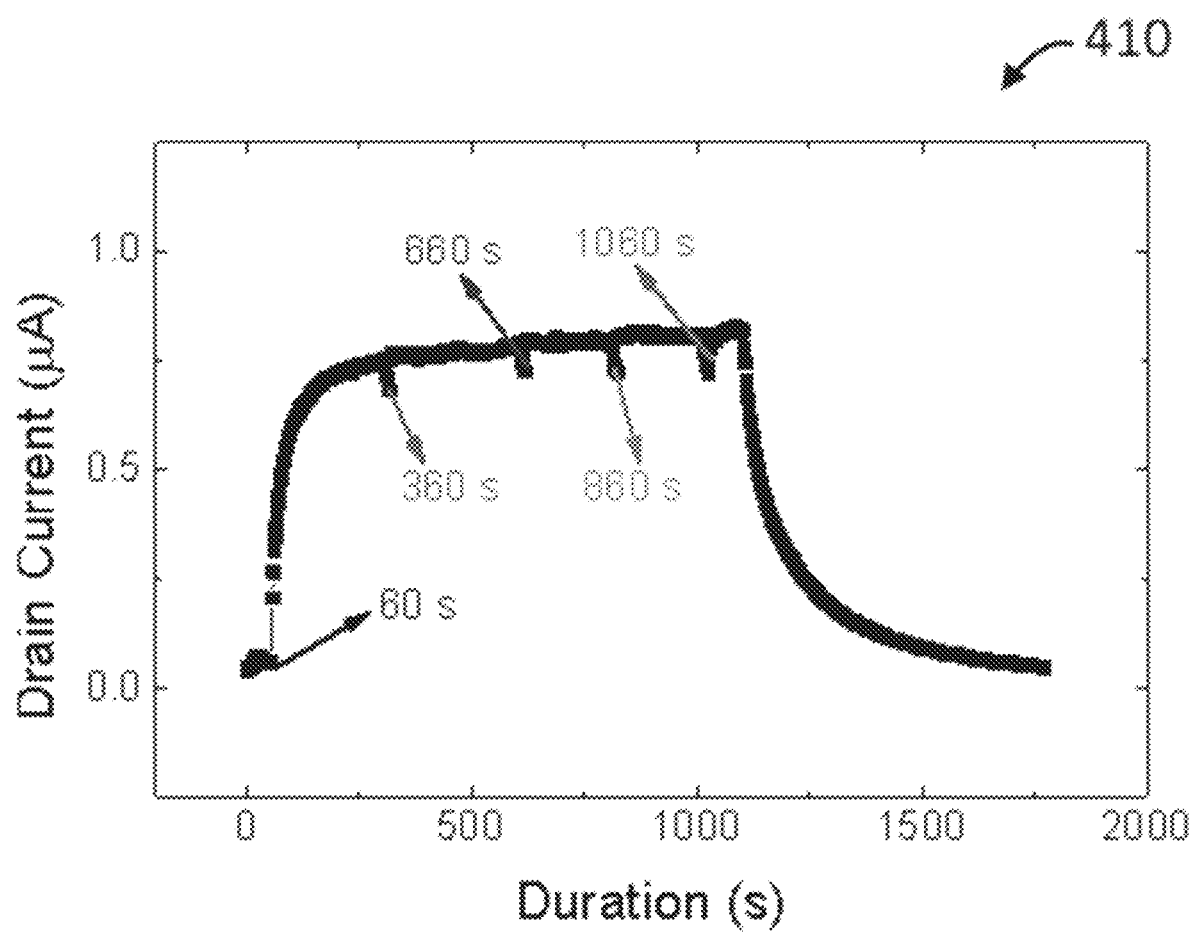
FIG. 4b is a graph showing photoresponse of an example MoS$_2$ based photosensor as a function of time under laser irradiation at ambient air.

FIG. 4b is a graph 410 showing photoresponse of an example $MoS_2$ based photosensor as a function of time under laser irradiation at ambient air. Photoluminescence (PL) measurements were conducted at 60 sec. 360 sec. 660 sec, 860 sec and 1060 sec, respectively. A 532 nm green light is used to induce photoresponse as well as serve as the optical source for PL measurements. As can be seen, $I_{DS}$ experiences a dip when PL measurement is conducted due to the change of instrument configuration to enable PL detection.

Figure 4C:
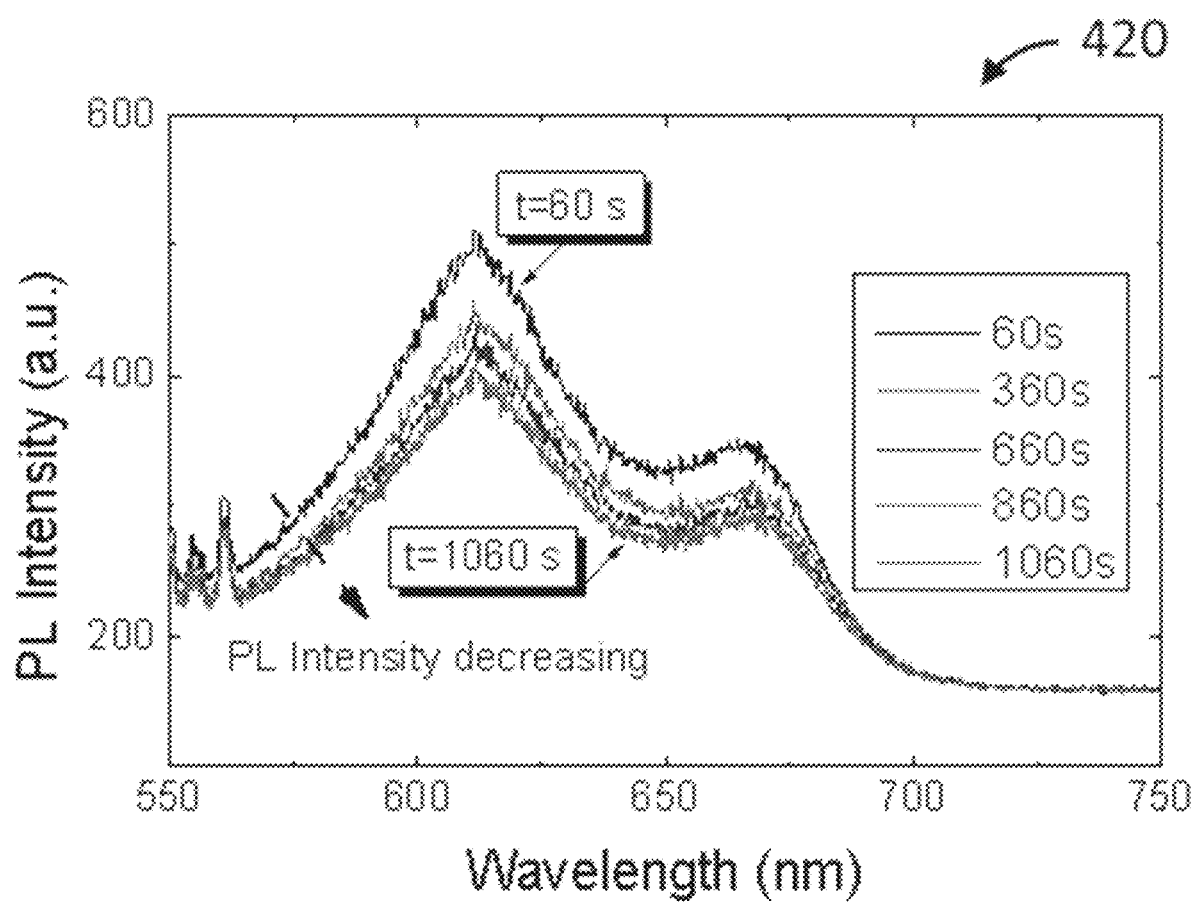
FIG. 4c is a graph showing PL spectra corresponding to the timings indicated in FIG. 4b.

FIG. 4c is a graph 420 showing PL spectra corresponding to the timings indicated in FIG. 4b. It may be observed that as irradiation time increases, the PL intensity decreases without noticeable peak shift. The fact the PL peaks remain un-shifted during this long time irradiation is an indication that the long time irradiation does not damage $MoS_2$. The reduction of PL intensity shows a good match with the change of $I_{DS}$ shown in FIG. 4a. The drop of the intensity between PL spectra at 60 sec and 360 sec is the largest, which corresponds to the largest change in $I_{DS}$ from 60 sec to 360 sec. As irradiation time increases further, $I_{DS}$ starts to saturate and the PL intensity shows no significant change as illustrated in 860 sec and 1060 sec PL spectra. The change of PL intensity is highly related to gas ($O_2$ and water vapor) adsorption on $MoS_2$. The decrease of PL intensity indicates less adsorbed gas molecules on $MoS_2$ with the increasing light irradiation time.

From results in FIGS. 4a and 4b, it may be understood that two mechanisms, electron-hole pair generation and gas desorption, contribute to $I_{DS}$ of $MoS_2$ based photosensors under light irradiation. Their influences and relationship may be further understood by considering measurements of $MoS_2$ sensors under different light irradiation and $O_2$ concentrations carried out in a vacuum chamber.

Figure 5A:
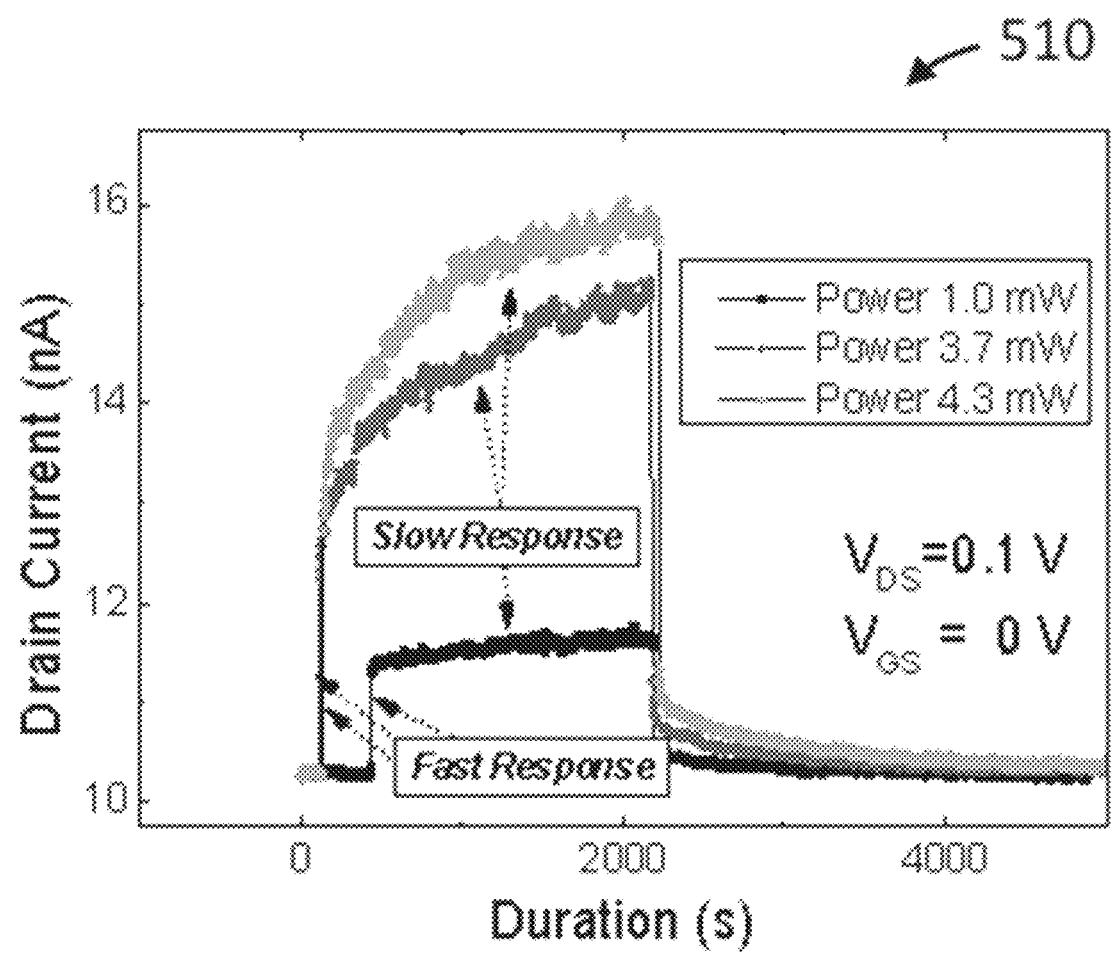
FIG. 5a is a graph that shows photoresponse of an example MoS$_2$ based photosensor under red light (650 nm) irradiation at different laser powers in vacuum with a constant O$_2$ pressure.

FIG. 5a is a graph 510 that shows photoresponse of an example $MoS_2$ based photosensor under red light (650 nm) irradiation at different laser powers in vacuum with a constant $O_2$ pressure. The laser powers are 1.0, 3.7 and 4.3 mW, respectively, with a spot size of ~0.87 $cm^2$. Under red light irradiation, $I_{DS}$ of the example $MoS_2$ based photosensor first experiences a sharp rise and then increases slowly. It takes a relatively long time to saturate. The photoresponse can be clearly identified as a two-step response: a fast response and a slow response. The fast response is believed to be due to electron-hole pair generation under light irradiation, while the slow response is believed to be due to optically induced gas desorption. For a photon with energy larger than $MoS_2$ bandgap, in addition to the energy required for the electron-hole pair generation, the remaining energy acts as an external force to enhance gas desorption.

Figure 5B:
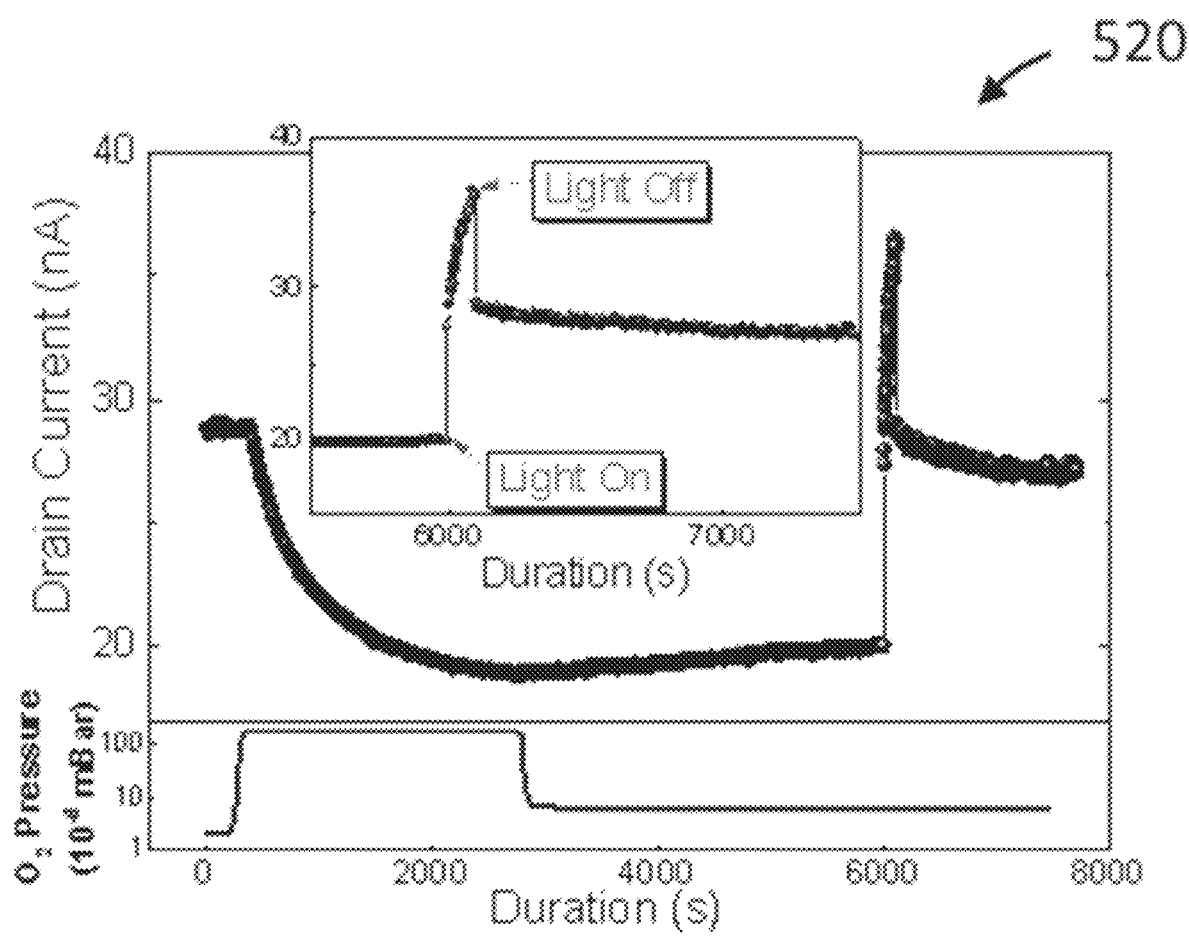
FIG. 5b is a graph that shows photoresponse of an example MoS$_2$ based photosensor with O$_2$ injection and white light irradiation assisted sensor recovery, with an upper insert that shows a zoom-in of the duration when light irradiation is turned on and off, and a lower insert that shows O$_2$ partial pressure with respect to duration.

FIG. 5b is a graph 520 that shows photoresponse of an example $MoS_2$ based photosensor with $O_2$ injection and white light irradiation assisted sensor recovery, with an upper insert that shows a zoom-in of the duration when light irradiation is turned on and off, and a lower insert that shows $O_2$ partial pressure with respect to duration. A white light irradiation with a light intensity of 1.27 mW/$cm^2$ occurs around at around 6000 seconds. The adsorption of $O_2$ on $MoS_2$ results in a continuous drop in $I_{DS}$ and after turning off $O_2$ injection $O_2$ desorption causes $I_{DS}$ to increase. Though the $O_2$ partial pressure in the chamber quickly returns to a low level, $I_{DS}$ of the $MoS_2$ device does not recover quickly. Moreover, its recovery nearly saturates at a much lower value than its initial one. After noticing $I_{DS}$ nearly saturates, a red light is turned on for 100 sec. A two-step photoresponse is first observed and then $I_{DS}$ drops and saturates at a value comparable to the initial value, demonstrating a much faster and nearly complete sensor recovery using an optically induced gas desorption mechanism.

Figure 5C:
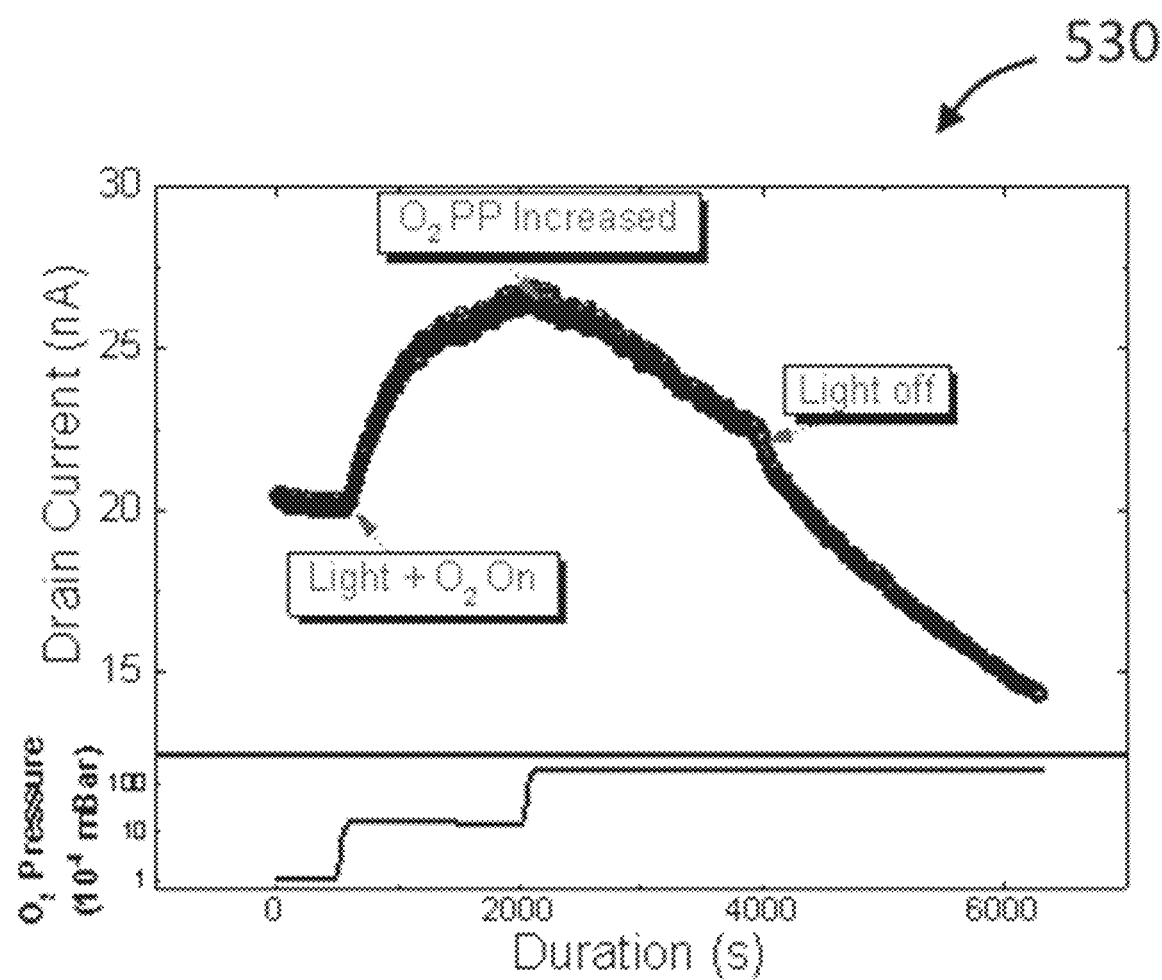
FIG. 5c is a graph that shows photoresponse of an example MoS$_2$ based photosensor with O$_2$ injection and white light irradiation, with a lower insert that shows O$_2$ partial pressure with respect to duration.

FIG. 5c is a graph 530 that shows photoresponse of an example $MoS_2$ based photosensor with $O_2$ injection and white light irradiation, with a lower insert that shows $O_2$ partial pressure with respect to duration. The white light irradiation and $O_2$ injection are turned on at the same time. $I_{DS}$ increases despite $O_2$ being injected into the chamber ($O_2$ partial pressure of $1.4 \times 10^{-5}$ mBar). The absence of an $O_2$ adsorption sensing response is due to the dominating photoresponse behavior. The change of $I_{DS}$ is a competing result between the adsorption sensing response (causing $I_{DS}$ to decrease) and photoresponse (causing $I_{DS}$ to increase). When $I_{DS}$ nearly saturates at the peak, the gas valve is tuned further to increase the flow rate of $O_2$ injection into the chamber ($O_2$ partial pressure of $2.1 \times 10^{-4}$ mBar). It is observed that $I_D$s of the example $MoS_2$ based photosensor starts to decrease, indicating that $O_2$ sensing response surpasses the photoresponse. After that, the light irradiation is turned off, and it is noted that without light irradiation, sensing response is slightly enhanced, as recognized from a steeper slope in drain current curve.

Figure 6A:
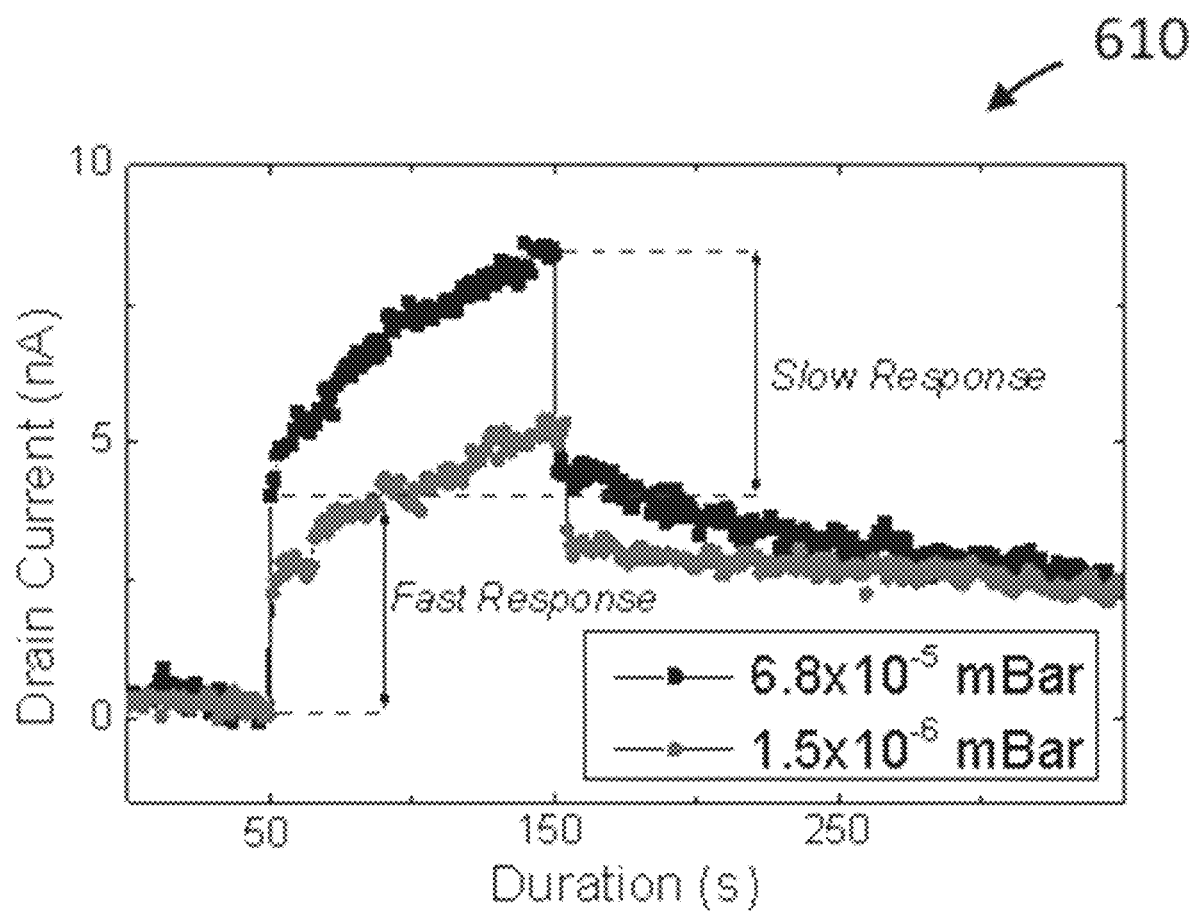
FIG. 6a is a graph that shows photoresponse of an example MoS$_2$ based photosensor at different O$_2$ partial pressures under red light irradiation.

FIG. 6a is a graph 610 that shows photoresponse of an example $MoS_2$ based photosensor at different $O_2$ partial pressures under red light irradiation. The red light irradiation is a pulse of 100 sec at $O_2$ partial pressure of $6.8 \times 10^{-5}$ and $1.5 \times 10^{-6}$ mBar, respectively. Similar to FIG. 5a, typical photoresponse consisting of a fast response and slow response is clearly observed. In this example, the interval of time that defines the fast response component is the first 1 second, such that the fast response component is $I_D$s change in the first 1 second. The rest of the $I_D$s change is considered to be part of the slow response component. The photoresponse at a higher $O_2$ partial pressure ($6.8 \times 10^{-5}$ mBar) exhibits a higher magnitude in both fast and slow response than those at $O_2$ partial pressure at $1.5 \times 10^{-6}$ mBar.

Figure 6B:
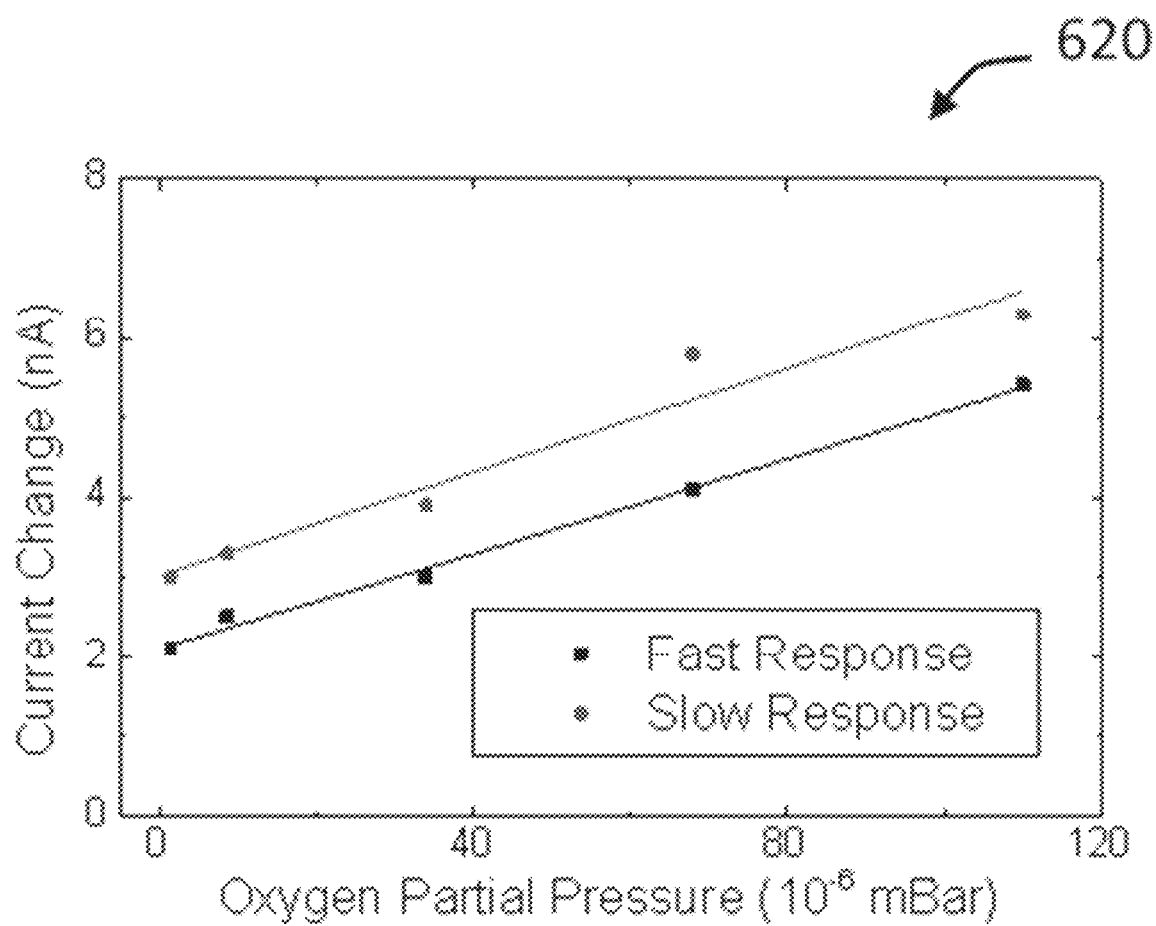
FIG. 6b is a graph that shows the relation between the fast response component and the slow response component of the photoresponse as a function of O$_2$ partial pressure.

FIG. 6b is a graph 620 that shows the relation between the fast response component and the slow response component of the photoresponse as a function of $O_2$ partial pressure. In this example, $O_2$ partial pressure ranges from $1.5 \times 10^{-6}$ to $1.1 \times 10^{-4}$ mBar. As can be seen, there is a strong dependence of $O_2$ partial pressure for both fast and slow response components. The slow response component increases with $O_2$ partial pressure. As $O_2$ partial pressure increases, more $O_2$ molecules are adsorbed on $MoS_2$, resulting in $I_{DS}$ increasing when the $MoS_2$ sensor is under red light irradiation. The fast response component also increases with $O_2$ partial pressure. This may be explained as $O_2$ adsorption on $MoS_2$ altering the optical properties of $MoS_2$ as photoluminescence intensity increases with adsorption of $O_2$ molecules on $MoS_2$. The dependence of an example $MoS_2$ based photosensor's photoresponse on $O_2$ partial pressure suggests a method to sense and determine $O_2$ partial pressure. This optically assisted $O_2$ sensing method may be advantageous as it can determine $O_2$ partial pressure quickly using the fast response component.

Figure 7A:
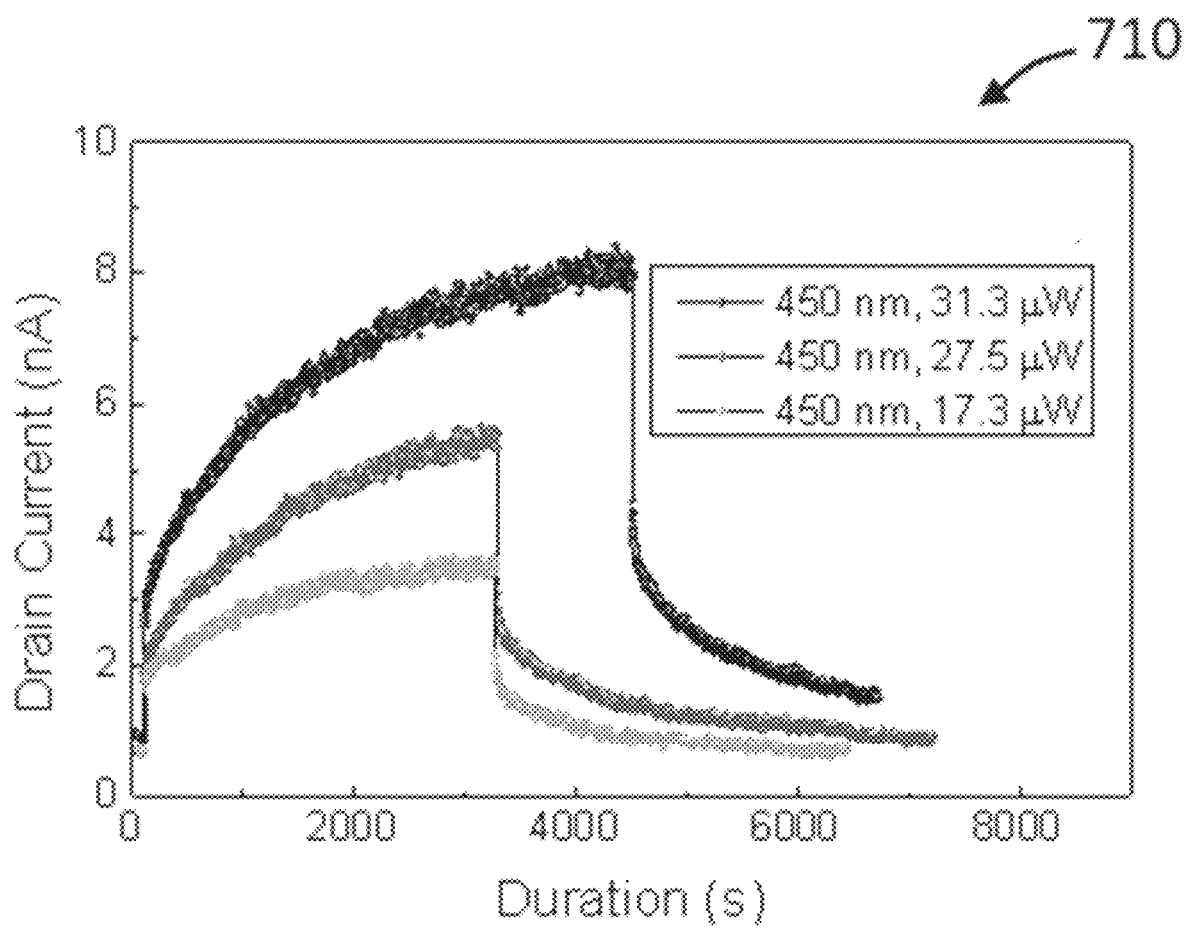
FIG. 7a is a graph showing photoresponse of an example MoS$_2$ based photosensor under visible light irradiation at a wavelength of 450 nm.
Figure 7B:
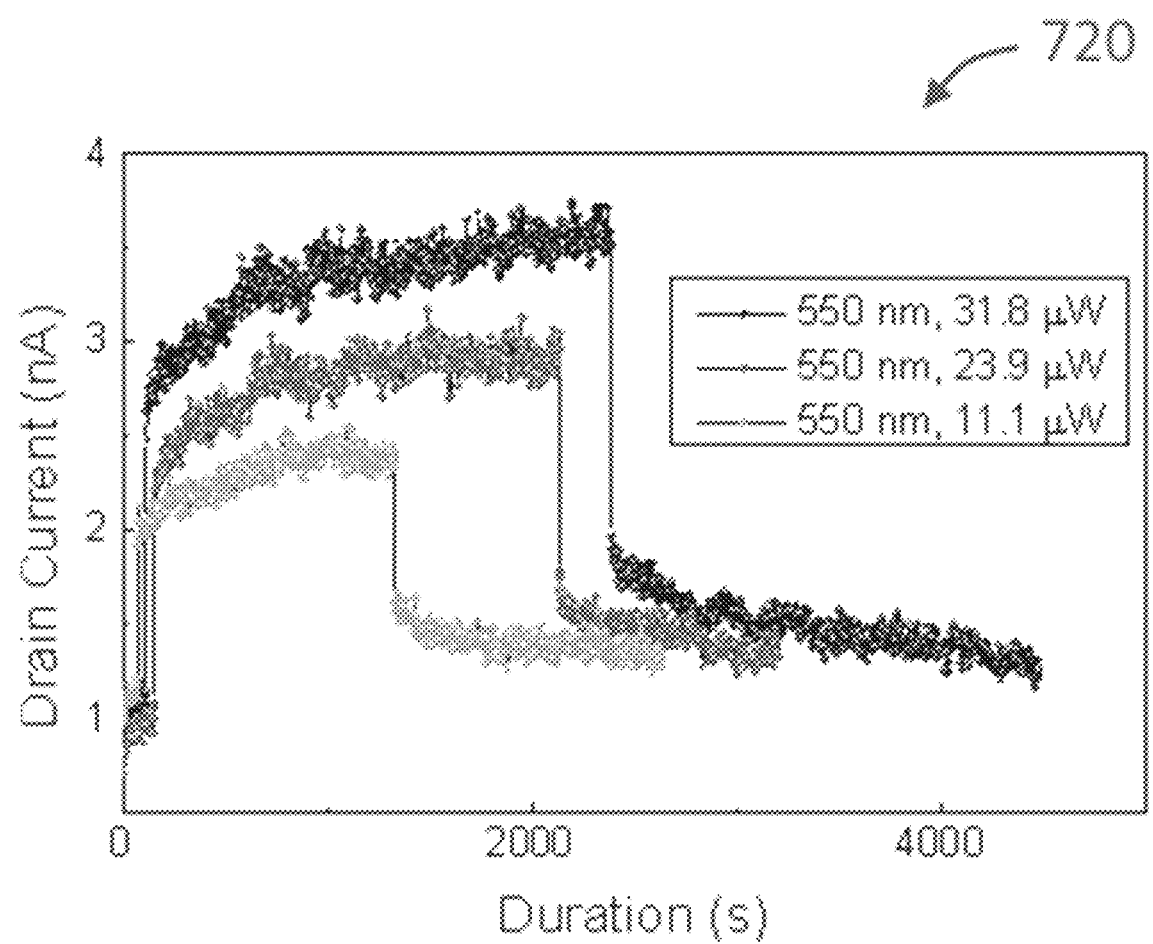
FIG. 7b is a graph showing photoresponse of an example MoS$_2$ based photosensor under visible light irradiation at a wavelength of 550 nm.
Figure 7C:
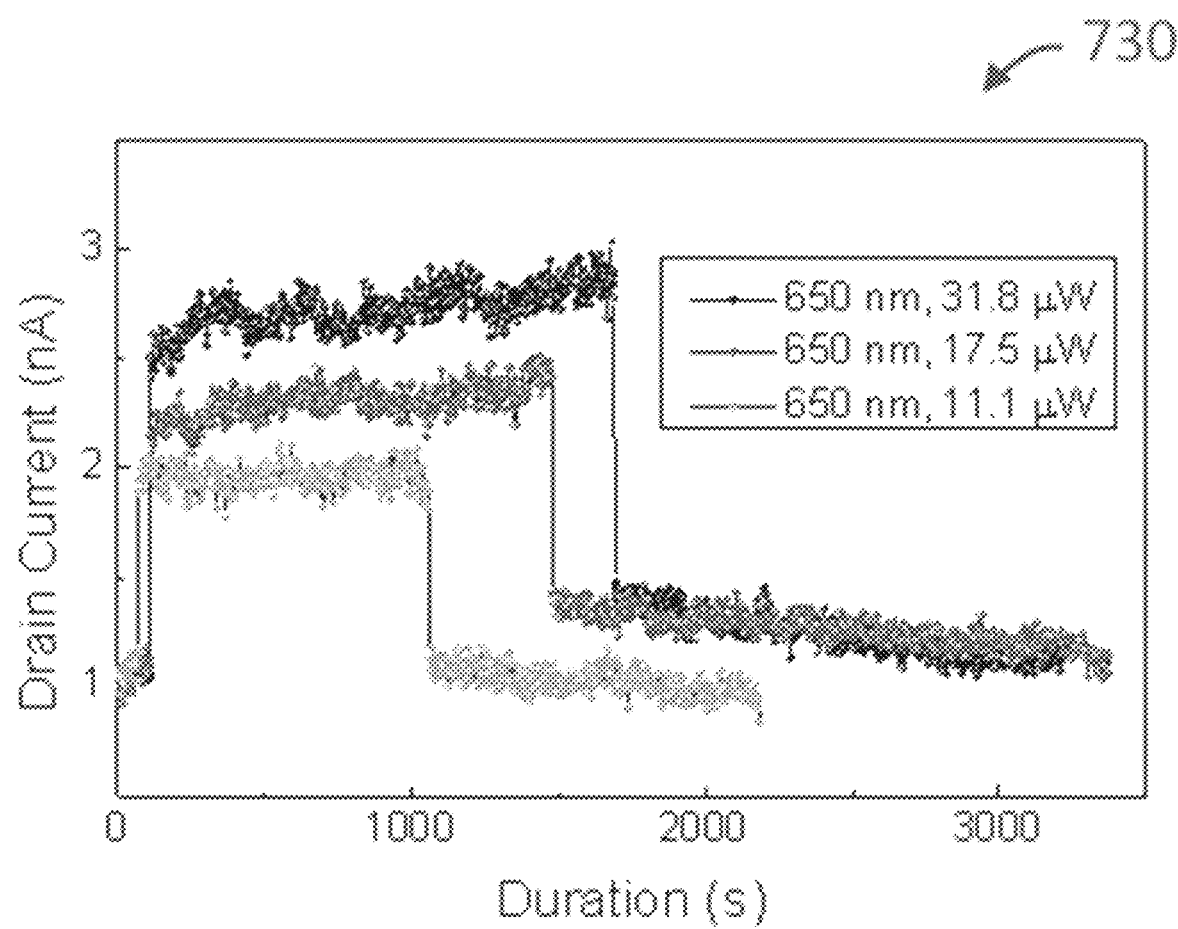
FIG. 7c is a graph showing photoresponse of an example MoS$_2$ based photosensor under visible light irradiation at a wavelength of 650 nm.

FIG. 7a is a graph 710 showing photoresponse of an example $MoS_2$ based photosensor under visible light irradiation at a wavelength of 450 nm. FIG. 7b is a graph 720 showing photoresponse of an example $MoS_2$ based photosensor under visible light irradiation at a wavelength of 550 nm. FIG. 7c is a graph 730 showing photoresponse of an example $MoS_2$ based photosensor under visible light irradiation at a wavelength of 650 nm. In FIGS. 7a-7c a white light source and different band-pass optical filters (with a bandwidth of around 5 nm) are employed to achieve the wavelengths. For each wavelength, different three light intensities were attempted, while the intensity was maintained at a certain range (10-40 uW). Generally, for all three wavelengths, the photoresponse exhibits a few similarities including a two-step response and a long saturation time. One difference that can be spotted in the photoresponse is that the slow response varies distinctively with respect to wavelength. The portion of the slow response becomes more pronounced when wavelength decreases.

Figure 8A:
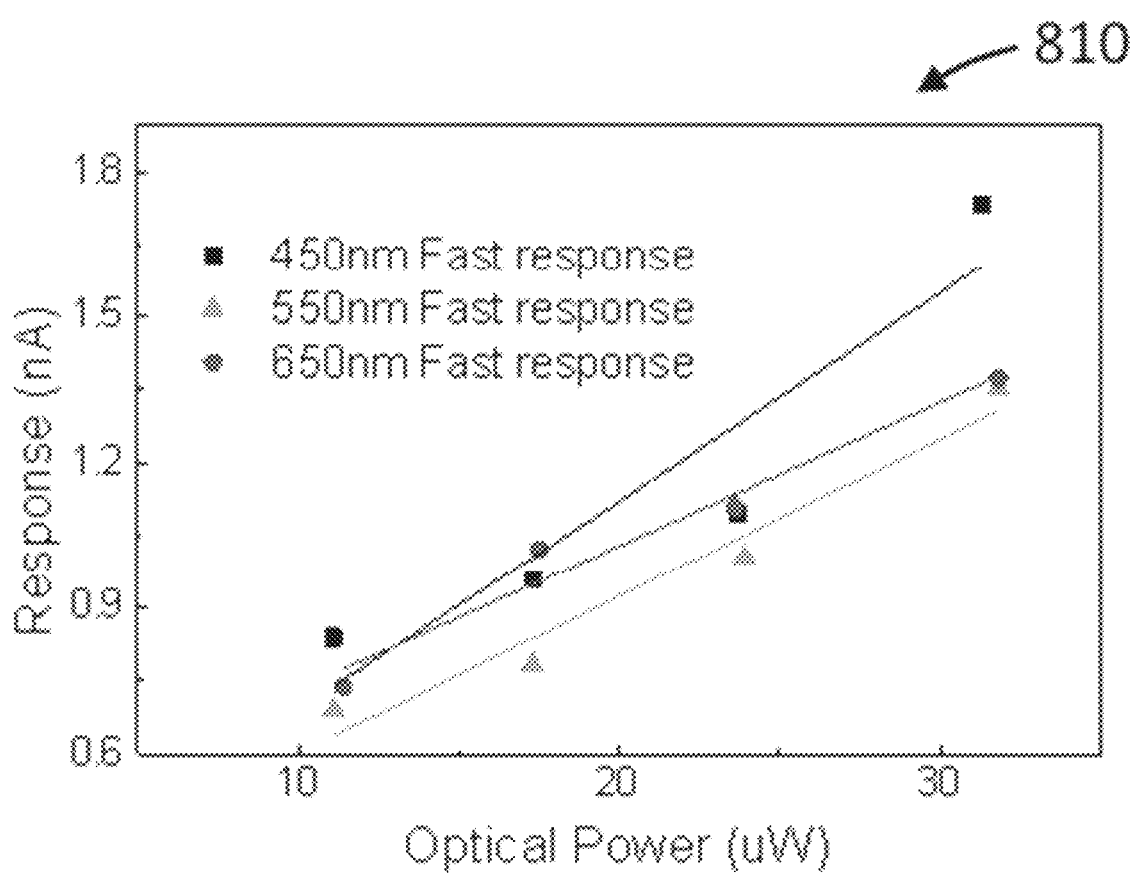
FIG. 8a is a graph comparing the fast response component of the photoresponse of an example MoS$_2$ based photosensor under 450 nm, 550 nm and 650 nm irradiation at ambient conditions.
Figure 8B:
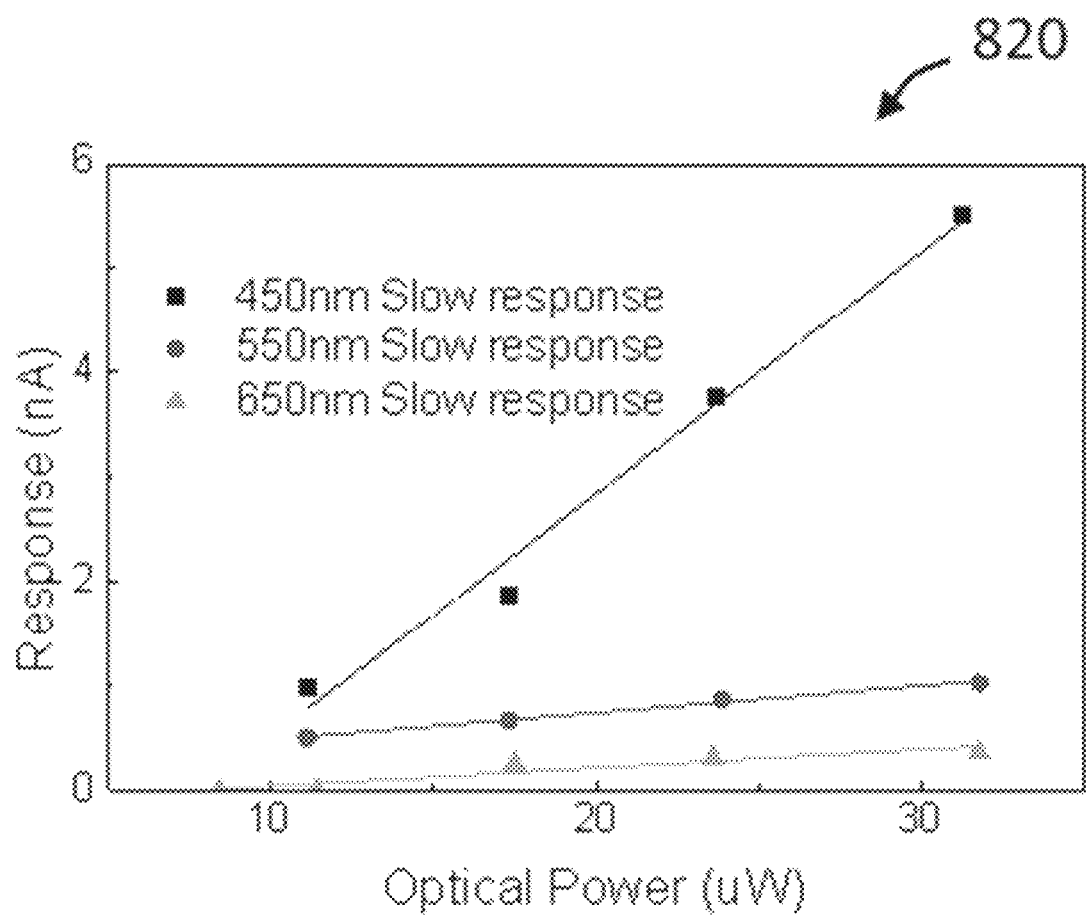
FIG. 8b is a graph comparing the slow response component of the photoresponse of an example MoS$_2$ based photosensor under 450 nm, 550 nm and 650 nm irradiation at ambient conditions.

FIG. 8a is a graph 810 comparing the fast response component of the photoresponse of an example $MoS_2$ based photosensor under 450 nm, 550 nm and 650 nm irradiation at ambient conditions. FIG. 8b is a graph 820 comparing the slow response component of the photoresponse of an example $MoS_2$ based photosensor under 450 nm, 550 nm and 650 nm irradiation at ambient conditions. The fast response component increases linearly with the optical power since more electron-hole pairs are generated under higher optical power. However, the fast response component is not significantly affected by the light wavelength. The slow response component also increases with the optical power, and further it exhibits a pronounced dependence with light wavelength. The wavelength of 450 nm shows a much larger slow response component, compared to those measured at 550 and 650 nm wavelengths. For photons with energy ($E_{ph}$) larger than $MoS_2$ bandgap ($E_g$), the generation of electron-hole pairs require energy of $E_g$, and the remaining energy ($E_{ph}-E_g$) could be used to enable gas desorption. A shorter wavelength light irradiation shows a more pronounced slow response component because of a larger $E_{ph}-E_g$. Under 450 nm wavelength light irradiation, the slow response component is greater than the fast response component and constitutes the majority of the photoresponse at the given intensity range. On the other hand, the fast response component is greater than the slow response component for both 550 nm and 650 nm irradiation. Under 650 nm irradiation, the slow response component is small and there is almost no slow response component when intensity is below 11.1 μW. The absence of a slow photoresponse can be understood because of a small $E_{ph}-E_g$ and a small number of photons.

As discussed above, the slow response component is originated from optically induced gas desorption. The rate of adsorption/desorption (dN/dt) may be governed by the equation: $dN/dt = k_{ad}(N_0-N)\rho_s - k_{de}N$, where, N and $N_0$ are the adsorbed analyte gas molecules and total available receptor sites on $MoS_2$, $\rho_s$ is the concentration of analyte molecules on $MoS_2$, and $k_{ad}$ and $k_{de}$ are the adsorption and desorption coefficients, respectively. Under equilibrium conditions, $k_{ad}(N_0-N)\rho_s = k_{de}N$. Under light irradiation, optical power likely enhances $k_{de}$ significantly and optical induced gas desorption occurs because of $k_{ad}(N_0-N)\rho_s \ll k_{de}N$. The slow response component ($I_{slow}$) is related to the number of desorbed gas molecules ($\Delta N$):
$I_{slow} \propto -\Delta N \propto C_1 \exp(k_{de}t) = C_1 \exp(C_2 E_{ph} t)$. Here, it is assumed that $k_{de} \propto E_{ph}$ since a larger photon energy provides a larger excess energy ($E_{ph}-E_g$) to induce gas desorption.

Figure 8C:
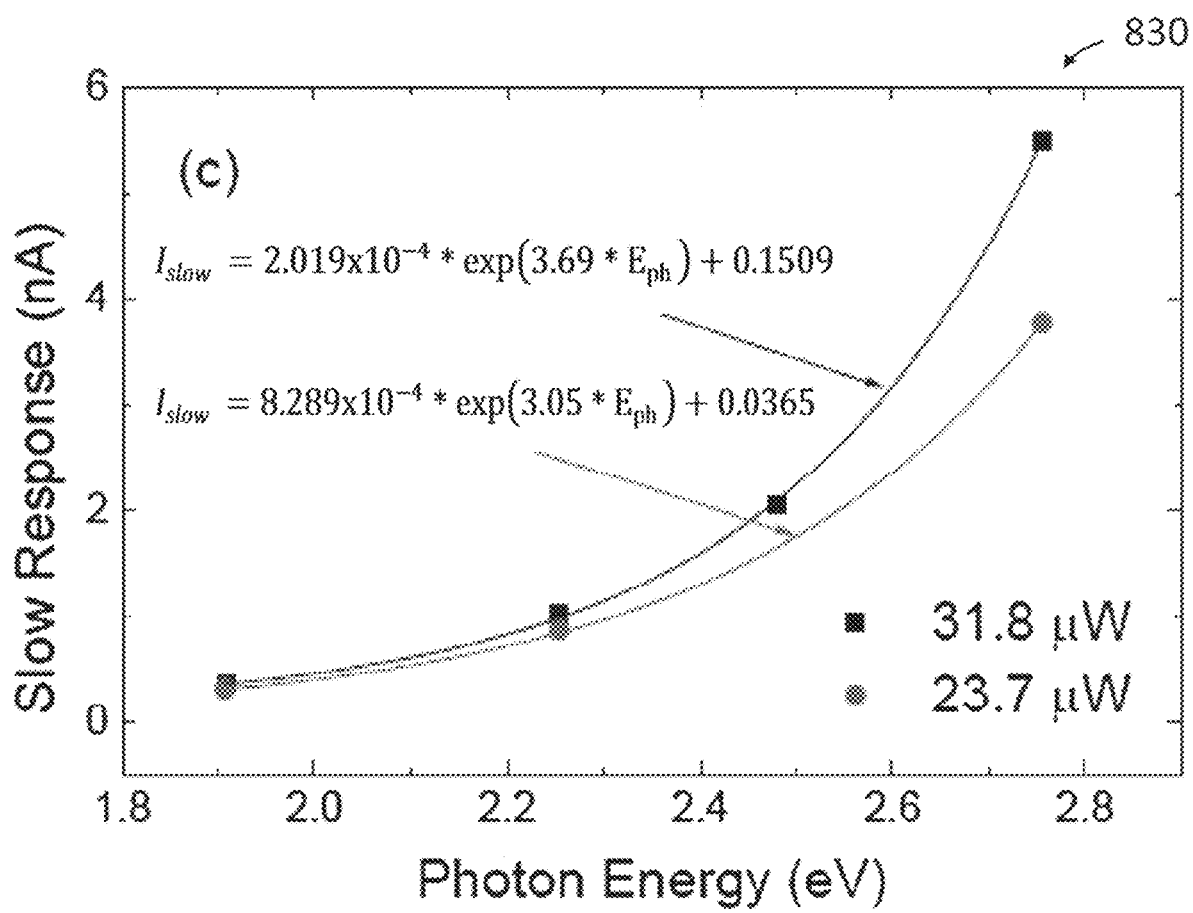
FIG. 8c is a graph showing the slow response component with respect to photon energy at an optical power around 31.8 and 23.7 µW.

FIG. 8c is a graph 830 showing the slow response component with respect to photon energy at an optical power around 31.8 and 23.7 μW. The fitting curves in FIG. 8c show an exponential relationship between the slow response component $I_{slow}$ and photon energy $E_{ph}$. This strong wavelength dependence of the $MoS_2$ based photosensor provides a method to distinguish the wavelength of the incoming light and its intensity.

In summary, the above disclosure describes and explains the operation principles of a $MoS_2$ based photosensor that is able to detect both light intensity and wavelength. It should be understood that various adaptations and modifications may be made to the above discussed techniques. For example, while it is discussed above that the photosensor may be based on $MoS_2$, it should be understood that other two-dimensional (2D) materials, including other 2D transition metal dichalcogenides, may also be used in place of $MoS_2$. In general, it should be appreciated that details included in the various example embodiments are merely provided for purposes of illustration, and are not intended to limit the scope, applicability, or configuration of the invention. For example, it should be understood that the various structures described above may be made from differing materials, implemented in different combinations or otherwise formed or used differently without departing from the intended scope of the invention.

What is claimed is:

1. An instrument comprising:
    a photosensor that includes
        a substrate including an insulating layer,
        one or more layers of a two-dimensional (2D) transition metal dichalcogenide disposed upon the substrate,
        a drain electrode and a source electrode disposed upon the substrate and arranged laterally with respect to the layers of 2D transition metal dichalcogenide layers, and
        a backgate electrode formed beneath the layers of 2D transition metal dichalcogenide layers and the insulating layer; and
    an electrical parameter analyzer coupled to the drain electrode, the electrical parameter analyzer configured to measure a photoresponse in terms of drain current verses time of the photosensor and utilize components of the photoresponse to determine both intensity and wavelength of light incident upon the photosensor.

2. The instrument of claim 1, wherein the 2D transition metal dichalcogenide layers comprise molybdenum disulfide ($MoS_2$) layers.

3. The instrument of claim 2, wherein the $MoS_2$ layers are $MoS_2$ nanoflake layers.

4. The instrument of claim 1, wherein the photoresponse includes a fast response component and a slow response component.

5. The instrument of claim 4, wherein an interval of time that defines a cut off between the fast response component and the slow response component is 1 second.

6. The instrument of claim 1, wherein the substrate comprises:
a silicon dioxide ($SiO_2$) insulating layer; and
a doped silicon (Si) substrate.

7. The instrument of claim 1, wherein the drain electrode and the source electrode each comprise gold (Au) electrodes.

8. The instrument of claim 1, wherein the backgate electrode is formed by silver (Ag) deposited within areas of the substrate.

9. An instrument comprising:
a photosensor having
a substrate,
one or more layers of a two-dimensional (2D) transition metal dichalcogenide disposed upon the substrate, and
a plurality of electrodes including a drain electrode; and
an electrical parameter analyzer coupled to the drain electrode, the electrical parameter analyzer configured to measure a photoresponse in terms of drain current verses time of the photosensor wherein the photoresponse includes a fast response component and a slow response component, and the electrical parameter analyzer is configured to determine both intensity and wavelength of light incident upon the photosensor by using the fast response component alone to determine the intensity of the light and the slow response component to determine the wavelength of the light.

10. The instrument of claim 9, wherein the 2D transition metal dichalcogenide layers comprise molybdenum disulfide ($MoS_2$) layers.

11. The instrument of claim 10, wherein the $MoS_2$ layers are $MoS_2$ nanoflake layers.

12. The instrument of claim 9, wherein an interval of time that defines a cut off between the fast response component and the slow response component is 1 second.

13. The instrument of claim 9, wherein the plurality of electrodes further comprise a source electrode and a backgate electrode.

14. The instrument of claim 9, wherein the substrate comprises:
a silicon dioxide ($SiO_2$) insulating layer; and
a doped silicon (Si) substrate.

15. A method of operating a photosensor that includes one or more layers of a two-dimensional (2D) transition metal dichalcogenide, the method comprising:
measuring a photoresponse provided by the one or more layers of the 2D transition metal dichalcogenide in terms of current verses time;
detecting a fast response component and a slow response component of the photoresponse;
based on the fast response component alone, determining intensity of light incident on the photosensor; and
based on the slow response component determining a wavelength of the light incident on the photosensor.

16. The method of claim 15, wherein the 2D transition metal dichalcogenide layers comprise molybdenum disulfide ($MoS_2$) layers.

17. The method of claim 15, wherein the photosensor is structured as a field effect transistor (FET) with a back-gate configuration.

18. The method of claim 15, wherein an interval of time that defines a cut off between the fast response component and the slow response component is 1 second.

* * * * *